(12) United States Patent
Leung et al.

(10) Patent No.: US 10,856,408 B1
(45) Date of Patent: Dec. 1, 2020

(54) SUBSTRATE-INTEGRATED DEVICE AND METHOD FOR MAKING THE SAME

(71) Applicant: City University of Hong Kong, Kowloon (HK)

(72) Inventors: Kwok Wa Leung, Kowloon (HK); Wai Ki Lee, Kowloon (HK); Hauke Ingolf Kremer, Kowloon (HK)

(73) Assignee: City University of Hong Kong, Kowloon (HK)

( * ) Notice: Subject to any disclaimer, the term of this patent is extended or adjusted under 35 U.S.C. 154(b) by 0 days.

(21) Appl. No.: 16/502,125

(22) Filed: Jul. 3, 2019

(51) Int. Cl.
| H05K 1/11 | (2006.01) |
| H05K 3/40 | (2006.01) |
| H05K 1/02 | (2006.01) |
| H01P 7/10 | (2006.01) |
| H01Q 1/22 | (2006.01) |

(52) U.S. Cl.
CPC ............ *H05K 1/0251* (2013.01); *H01P 7/10* (2013.01); *H01Q 1/2283* (2013.01); *H05K 1/024* (2013.01); *H05K 1/0243* (2013.01); *H05K 1/115* (2013.01); *H05K 3/4038* (2013.01); *H05K 2201/10068* (2013.01); *H05K 2201/10098* (2013.01); *H05K 2203/1461* (2013.01)

(58) Field of Classification Search
CPC ......... H05K 1/115; H05K 3/4038; H05K 3/42
See application file for complete search history.

(56) References Cited

U.S. PATENT DOCUMENTS

| 5,354,599 A | 10/1994 | McClanahan et al. |
| 2002/0179332 A1* | 12/2002 | Uematsu ................ H05K 1/115 174/262 |
| 2009/0297804 A1* | 12/2009 | Paul ...................... C01G 23/006 428/210 |
| 2013/0199834 A1* | 8/2013 | De Geest ............... H05K 1/024 174/266 |
| 2014/0097918 A1 | 4/2014 | Hajase et al. |
| 2017/0009090 A1 | 1/2017 | Haghzadeh et al. |
| 2018/0027648 A1* | 1/2018 | Wu ....................... H01L 21/485 174/360 |
| 2018/0177041 A1 | 6/2018 | Huang et al. |

* cited by examiner

*Primary Examiner* — Jeremy C Norris
(74) *Attorney, Agent, or Firm* — Renner Kenner Greive Bobak Taylor & Weber (57) ABSTRACT

A substrate-integrated device includes a substrate layer with a first dielectric constant and one or more dielectric vias, the one or more dielectric vias each includes a via-hole extending through the substrate layer, and a dielectric material with a second dielectric constant contained within the via-hole. The second dielectric constant is larger than, preferably at least two times, the first dielectric constant.

34 Claims, 7 Drawing Sheets

SUBSTRATE-INTEGRATED DEVICE AND METHOD FOR MAKING THE SAME

TECHNICAL FIELD

The invention relates to a substrate-integrated device and a method for making a substrate-integrated device.

BACKGROUND

A via is an electrical connection between different layers in an electronic circuit. Conventional vias are metallic vias in the form of a "metallized" hole (i.e., a hole coated with a metallic material) in a substrate.

Metallic vias are commonly used in RF (such as PCB applications) and IC technologies. In RF technology, metallic via-holes are used in place of solid metallic walls. In IC technology, metallic vias are used to electrically connect different layers of substrates with each other. Problematically, however, these metallic vias may suffer from high loss in some applications, such as applications as microwave frequencies. Also, the process for "metallizing" the holes to produce the vias can be time-consuming and costly.

SUMMARY OF THE INVENTION

In accordance with a first aspect of the invention, there is provided a substrate-integrated device, having: a substrate layer with a first dielectric constant and one or more dielectric vias. The one or more dielectric vias each having a via-hole extending through the substrate layer, and a dielectric material with a second dielectric constant contained within the via-hole. The second dielectric constant (relative permittivity) is larger than the first dielectric constant. Preferably, the second dielectric constant is at least two times, at least three times, at least four times, at least five times, or at least ten times of the first dielectric constant.

In one embodiment of the first aspect, the via-hole is filled substantially completely with the dielectric material.

In one embodiment of the first aspect, the first electric constant is at least 2 and the second dielectric constant is at least 4. Preferably, the second dielectric constant is at least 10, at least 15, or at least 20.

In one embodiment of the first aspect, the one or more dielectric vias includes a plurality of dielectric vias. The plurality of dielectric vias may be arranged regularly or randomly. The plurality of dielectric vias may be spaced apart evenly. In one example, the plurality of dielectric vias includes dielectric vias arranged in at least two parallel rows, each of the two parallel rows having two or more dielectric vias. One or more dielectric vias may further be arranged between the two parallel rows. In one example, two adjacent parallel rows of dielectric vias define, between the two rows, a wave guiding channel.

In one embodiment of the first aspect, the dielectric material includes perovskite oxide. The perovskite oxide may include one or more of: Barium Titanate, Barium Strontium Titanate, Lead ZirconateTitanate, and Lead Lanthanum ZirconateTitanate.

In one embodiment of the first aspect, the dielectric material is in the form of a paste. In one example, the paste includes perovskite oxide particles. The perovskite oxide particles may include one or more of: Barium Titanate particles, Barium Strontium Titanate particles, Lead ZirconateTitanate particles, and Lead Lanthanum ZirconateTitanate particles. The perovskite oxide particles may be sized between 30 nm to 2000 nm, or they may have an average size between 30 nm to 2000 nm.

In one embodiment of the first aspect, the substrate-integrated device further includes a first material layer arranged on one side of the substrate layer. The first material layer may include a prepreg, a metallic layer, or a dielectric layer with the dielectric material.

In one embodiment of the first aspect, the substrate-integrated device further includes a second material layer arranged on the other side of the substrate layer. The second material layer may include a prepreg, a metallic layer, or a dielectric layer with the dielectric material.

In one embodiment of the first aspect, the substrate-integrated device is a microwave device.

In one embodiment of the first aspect, the substrate-integrated device is a printed circuit board.

In one embodiment of the first aspect, the substrate-integrated device is a substrate-integrated waveguide.

In one embodiment of the first aspect, the substrate-integrated device is a substrate-integrated dielectric resonator.

In one embodiment of the first aspect, the substrate-integrated dielectric resonator is part of a substrate-integrated dielectric resonator antenna.

In one embodiment of the first aspect, the substrate-integrated dielectric resonator is part of a substrate-integrated dielectric resonator filter.

In one embodiment of the first aspect, the substrate-integrated device is arranged to operate at radio frequency range.

In accordance with a second aspect of the invention, there is provided a method for making a substrate-integrated device, comprising: arranging, in one or more via-holes of a substrate layer with a first dielectric constant, a dielectric material with a second dielectric constant, thereby forming one or more dielectric vias. The one or more dielectric vias each having a via-hole formed in the substrate layer, and a dielectric material with a second dielectric constant contained within the via-hole. The second dielectric constant is larger than the first dielectric constant. Preferably, the second dielectric constant is at least two times, at least three times, at least four times, at least five times, or at least ten times of the first dielectric constant.

In one embodiment of the second aspect, arranging the dielectric material in the one or more via-holes includes: filling the one or more via-holes substantially completely with the dielectric material.

In one embodiment of the second aspect, the first dielectric constant is at least 2 and the second dielectric constant is at least 4. Preferably, the second dielectric constant is at least 10, at least 15, or at least 20.

In one embodiment of the second aspect, the dielectric material comprises perovskite oxide. The perovskite oxide may include one or more of: Barium Titanate, Barium Strontium Titanate, Lead ZirconateTitanate, and Lead Lanthanum ZirconateTitanate.

In one embodiment of the second aspect, arranging the dielectric material in the one or more via-holes includes: arranging a paste including the dielectric material in the one or more via-holes.

In one embodiment of the second aspect, the paste comprises pre-sintered perovskite oxide particles and a solvent. The pre-sintered perovskite oxide particles may include one or more of: Barium Titanate particles, Barium Strontium Titanate particles, Lead ZirconateTitanate particles, and Lead Lanthanum ZirconateTitanate particles. The solvent may include one or more of: Xylene, Toluene, and Tetrahydrofuran. The perovskite oxide particles may be sized between 30 nm to 2000 nm, or they may have an average size between 30 nm to 2000 nm.

In one embodiment of the second aspect, arranging the dielectric material in the one or more via-holes further includes: heating the paste to evaporate the solvent and attach the dielectric material to the substrate.

In one embodiment of the second aspect, arranging the dielectric material in the one or more via-holes further includes: enclosing the one or more via-holes to retain the paste in the one or more via-holes.

In one embodiment of the second aspect, enclosing the one or more via-holes includes: arranging a first material layer on one side of the substrate and at a first end of the one or more via-holes and arranging a second material layer on another side of the substrate and at a second end of the one or more via-holes to enclose the one or more via-holes. The first material layer and the second material layer each includes a prepreg, a metallic layer, or a dielectric layer with the dielectric material.

In accordance with a third aspect of the invention, there is provided a substrate-integrated device made using the method of the second aspect.

In accordance with a fourth aspect of the invention, there is provided a structure for confining electromagnetic energy, having: a substrate layer with a first dielectric constant and one or more dielectric vias. The one or more dielectric vias each having a via-hole extending through the substrate layer, and a dielectric material with a second dielectric constant contained within the via-hole. The second dielectric constant (relative permittivity) is larger than the first dielectric constant. Preferably, the second dielectric constant is at least two times, at least three times, at least four times, at least five times, or at least ten times of the first dielectric constant.

In one embodiment of the fourth aspect, the via-hole is filled substantially completely with the dielectric material.

In one embodiment of the fourth aspect, the first dielectric constant is at least 2 and the second dielectric constant is at least 4. Preferably, the second dielectric constant is at least 10, at least 15, or at least 20.

In one embodiment of the fourth aspect, the one or more dielectric vias includes a plurality of dielectric vias. The plurality of dielectric vias may be arranged regularly or randomly. The plurality of dielectric vias may be spaced apart evenly. In one example, the plurality of dielectric vias includes dielectric vias arranged in at least two parallel rows, each of the two parallel rows having two or more dielectric vias. One or more dielectric vias may further be arranged between the two parallel rows. In one example, two adjacent parallel rows of dielectric vias define, between the two rows, a wave guiding channel.

In one embodiment of the fourth aspect, the dielectric material includes perovskite oxide. The perovskite oxide may include one or more of: Barium Titanate, Barium Strontium Titanate, Lead ZirconateTitanate, and Lead Lanthanum ZirconateTitanate.

In one embodiment of the fourth aspect, the dielectric material is in the form of a paste. In one example, the paste includes perovskite oxide particles. The perovskite oxide particles may include one or more of: Barium Titanate particles, Barium Strontium Titanate particles, Lead ZirconateTitanate particles, and Lead Lanthanum ZirconateTitanate particles. The perovskite oxide particles may be sized between 30 nm to 2000 nm, or they may have an average size between 30 nm to 2000 nm.

In one embodiment of the fourth aspect, the structure further includes a first material layer arranged on one side of the substrate layer. The first material layer may include a prepreg, a metallic layer, or a dielectric layer with the dielectric material.

In one embodiment of the fourth aspect, the structure further includes a second material layer arranged on the other side of the substrate layer. The second material layer may include a prepreg, a metallic layer, or a dielectric layer with the dielectric material.

In accordance with a fifth aspect of the invention, there is provided a microwave device including the structure of the fourth aspect.

In accordance with a sixth aspect of the invention, there is provided a substrate-integrated waveguide including the structure of the fourth aspect.

In accordance with a seventh aspect of the invention, there is provided a substrate-integrated dielectric resonator including the structure of the fourth aspect.

In accordance with a eighth aspect of the invention, there is provided a substrate-integrated dielectric resonator antenna including the structure of the fourth aspect.

In accordance with a eighth aspect of the invention, there is provided a substrate-integrated dielectric resonator filter including the structure of the fourth aspect.

In accordance with a ninth aspect of the invention, there is provided a substrate-integrated dielectric resonator antenna, including a first substrate layer with a first dielectric constant; one or more dielectric vias each having a via-hole formed in the substrate layer, and a dielectric material with a second dielectric constant contained within the via-hole, the second dielectric constant is larger than (e.g., at least two times) the first dielectric constant; a ground plane arranged on one side of the first substrate layer; a second substrate layer attached to the first substrate layer via the ground plane; and a microstrip line attached to the second substrate layer on a side opposite to the ground plane. Preferably, in plan view, the microstrip at least partly overlaps with the one or more dielectric vias and with a slot formed in the ground plane.

In accordance with a tenth aspect of the invention, there is provided a printed circuit board including the structure of the fourth aspect.

BRIEF DESCRIPTION OF THE DRAWINGS

Embodiments of the invention will now be described, by way of example, with reference to the accompanying drawings in which.

DETAILED DESCRIPTION OF THE PREFERRED EMBODIMENT

Figure 1A:
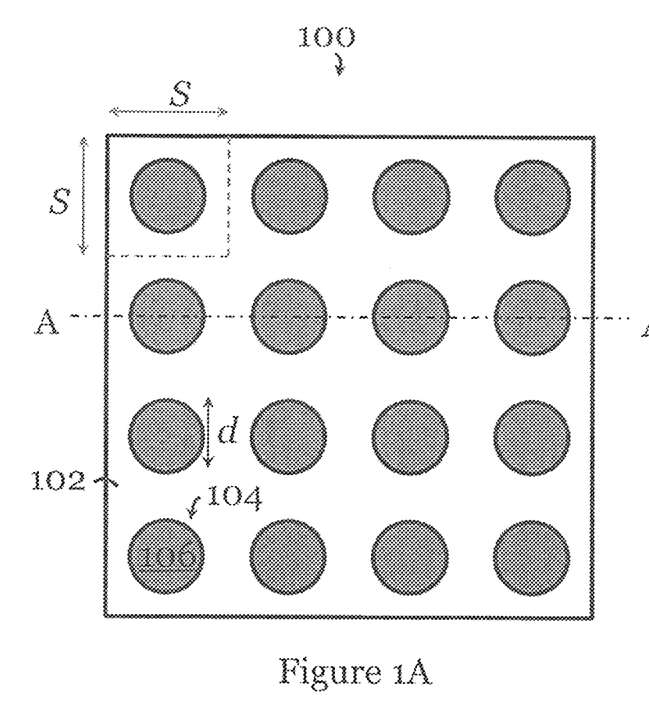
FIG. 1A is a plan view of a structure with dielectric vias in one embodiment of the invention.
Figure 1B:
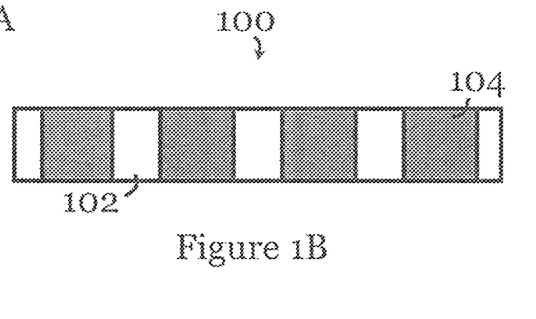
FIG. 1B is a sectional view of the structure of FIG. 1A take along line A-A in FIG. 1A.

FIGS. 1A and 1B show a structure too with dielectric vias 104 in plan view. The structure too can be used to confine or guide electromagnetic energy. As shown in FIGS. 1A and 1B, the structure too includes a substrate layer 102 with a first dielectric constant. The substrate layer 102 may be formed of a substrate material used in printed circuit boards, and the first dielectric constant may be around 2 to around 4. In this example, sixteen dielectric vias 104 are arranged in the substrate layer 102, in a 4×4 array. Each of the dielectric vias 104 includes a via-hole of circular cross section and diameter d extending through the substrate layer 102 and a dielectric material 106 filled inside the via-hole. The dielectric material 106 filling the via-hole has a dielectric constant (relative permittivity) that is at least two times the dielectric constant of the substrate layer 102. Preferably, the first dielectric constant is at least 2 and the second dielectric constant is at least 4. In some example, the second dielectric constant can be at least to, at least 15, or at least 20.

In this embodiment, the dielectric material 106 includes perovskite oxide. Example of perovskite oxide includes Barium Titanate, Barium Strontium Titanate, Lead ZirconateTitanate, and Lead Lanthanum ZirconateTitanate. The dielectric material 106 may be in the form of a paste retained in the via-hole, or may be in the form of a solid solidified from an initial paste form. In one example, the paste includes perovskite oxide particles. Example of perovskite oxide particles include one or more of: Barium Titanate particles, Barium Strontium Titanate particles, Lead ZirconateTitanate particles, and Lead Lanthanum ZirconateTitanate particles. The perovskite oxide particles are sized in one dimension between 30 nm to 2000 nm. On average, the perovskite oxide particles can be sized in one dimension between 30 nm to 2000 nm. In the example that the dielectric material 106 is a paste, the structure too may further include two material layers, one on each side of the substrate, to enclose the via-holes hence retain the dielectric materials 106 in the via-holes. These two material layers may be a prepreg, a metallic layer, or a dielectric layer with the dielectric material same as that filled in the via-holes.

In the structure 100, the dielectric vias 104 act as electric walls that provide a highly reflective boundary for confining or directing electromagnetic energy impinging on the walls. The structure 100 has a unit cell size of S×S.

The structure 100 in FIG. 1 can be incorporated or can form a substrate-integrated device. Examples of the substrate-integrated device include: microwave device, printed circuit board, substrate-integrated waveguide, substrate-integrated dielectric resonator (which may be part of a substrate-integrated dielectric resonator antenna or filter). The substrate-integrated device is preferably arranged to operate at radio frequency or microwave range.

Figure 2:
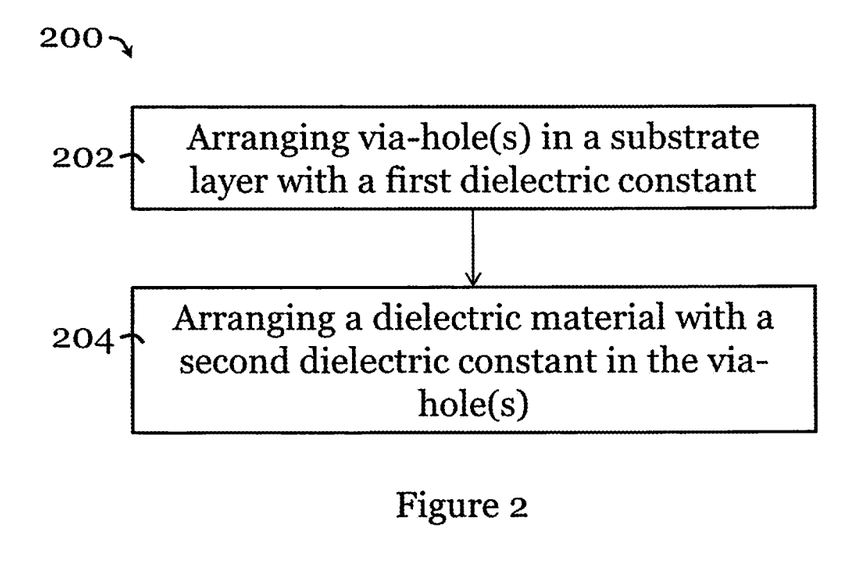
FIG. 2 is a flow chat of a method for making the structure of FIG. 1.

FIG. 2 shows a method 200 for making the structure of FIG. 1 in one embodiment of the invention. The method 200 begins in step 202, in which one or more via-holes 106 are arranged in the substrate layer 102 with the first dielectric constant. The via-holes may be arranged in the substrate layer by cutting, drilling, or the like. Then the method proceeds to step 204, in which the dielectric material 106 with the second dielectric constant is arranged in the via-holes, to form the structure 100. Step 204 may involve coating the via-hole with the dielectric material 106. Alternatively, step 204 may involve filling the via-hole partly or completely with the dielectric material 106. In one embodiment, step 204 includes arranging a paste with the dielectric material 106 and optionally a solvent in the via-holes. The paste may include pre-sintered perovskite oxide particles and a solvent. The pre-sintered perovskite oxide particles may include one or more of: Barium Titanate particles, Barium Strontium Titanate particles, Lead ZirconateTitanate particles, and Lead Lanthanum ZirconateTitanate particles; while the solvent may include one or more of: Xylene, Toluene, and Tetrahydrofuran.

Various methods can be used to attach or otherwise fix the dielectric material 106 to the substrate 102. In one example, the paste may be heated to evaporate the solvent and solidify the dielectric material 106 so as to attach the dielectric material 106 to the substrate 102. In another example, the paste may be enclosed in the via-holes by two material layers one on each side of the substrate (and each end of the via-hole). The two material layers may be a prepreg, a metallic layer, or a dielectric layer with the dielectric material 106.

Figure 3:
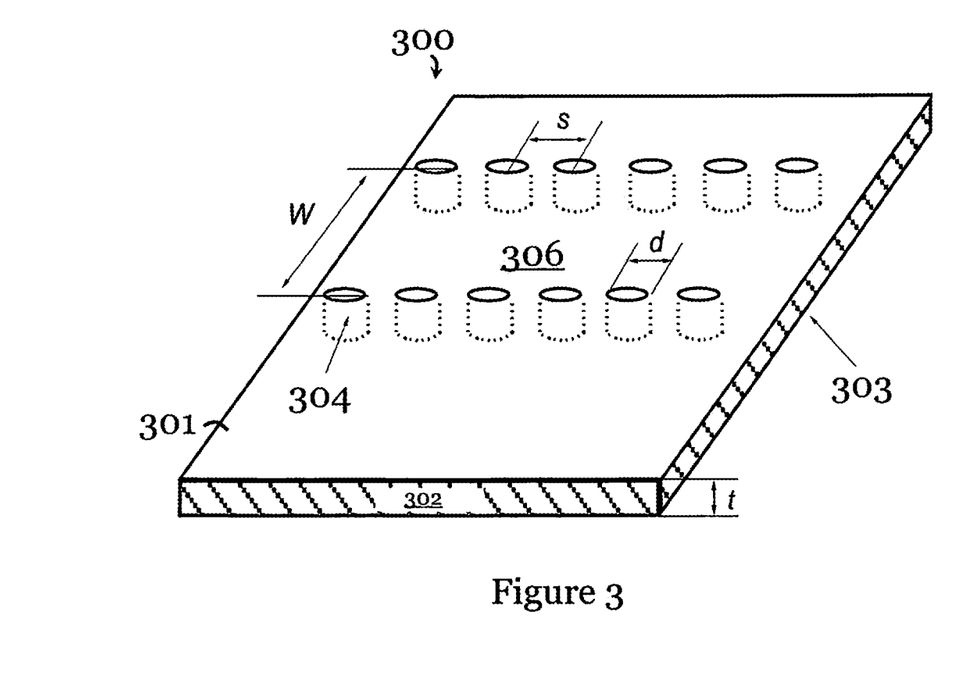
FIG. 3 is a perspective view of a substrate-integrated waveguide in one embodiment of the invention.

FIG. 3 shows a substrate-integrated waveguide (SIW) 300 in one embodiment of the invention. The waveguide 300 has a similar basic structure as the structure 100 of FIG. 1. In FIG. 3, the waveguide includes an upper metallic layer (very thin) 301, a middle substrate layer 302, and a lower metallic layer (very thin) 303. Dielectric vias 304 of circular cross sectional and diameter d are arranged in the middle substrate layer 302. In this embodiment, the dielectric vias 304 are arranged in two parallel rows. The dielectric vias 304 in the same row are spaced apart generally equally, with a separation (pitch, distance between cross sectional centers of adjacent vias in the same row) S. The two rows are separate by a separation (distance between cross sectional centers of corresponding vias) W. The space between the two parallel rows of the dielectric vias 304 defines a wave guiding channel 306. In some embodiments, further dielectric vias (not shown) can be arranged between the two rows to provide filtering function.

Figure 4A:
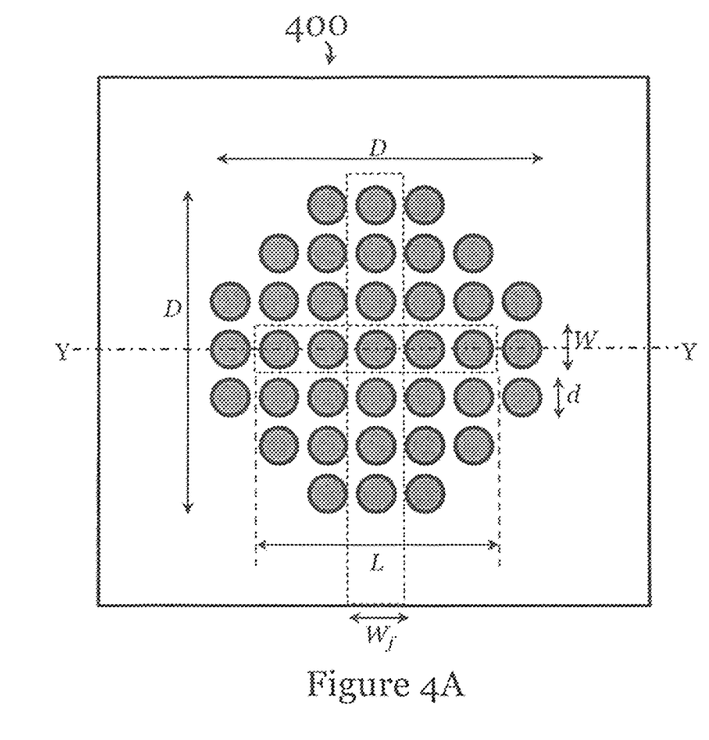
FIG. 4A is a plan view of a substrate-integrated dielectric resonator antenna in one embodiment of the invention.
Figure 4B:
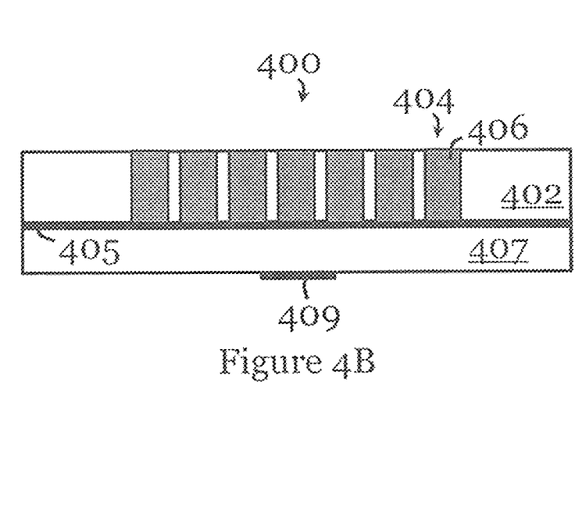
FIG. 4B is a sectional view of the substrate-integrated dielectric resonator antenna take along line Y-Y in FIG. 4A.

FIGS. 4A and 4B show a substrate-integrated dielectric resonator antenna 400 in one embodiment of the invention. The dielectric resonator antenna 400 has a similar basic structure as the structure 100 of FIG. 1. As shown in FIGS. 4A and 4B, the dielectric resonator antenna 400 includes a first upper substrate layer 402 with a first dielectric constant. An array of dielectric vias 404 is arranged in the first upper substrate layer 402. The array of dielectric vias 404 resembles the shape of a dielectric resonator. Each dielectric via 404 includes a via-hole formed in the substrate layer 402 and a dielectric material 406 filled in the via-hole. The dielectric constant of the dielectric material 406 is at least two times the dielectric constant of the substrate 402. The dielectric resonator antenna 400 also has a ground plane 405 arranged below the first substrate layer 402. A second substrate layer 407 containing a feeding mechanism is attached to the first substrate layer 402 via the ground plane 405. The feeding mechanism includes a slot (see FIG. 4A, horizontal rectangle in dotted line) and a microstrip line 409 attached to the bottom of the second substrate layer 407. The slot is arranged in the ground plane. The microstrip overlaps with some of the dielectric vias 404 in plan view. The dielectric resonator antenna 400 is excited by the slot of width W and length L which is fed by the microstrip line of width $W_f$. The dielectric resonator antenna 400 in this embodiment can be excited to various operation modes, including but not limited to HEM11$_\delta$ mode.

Figure 5:
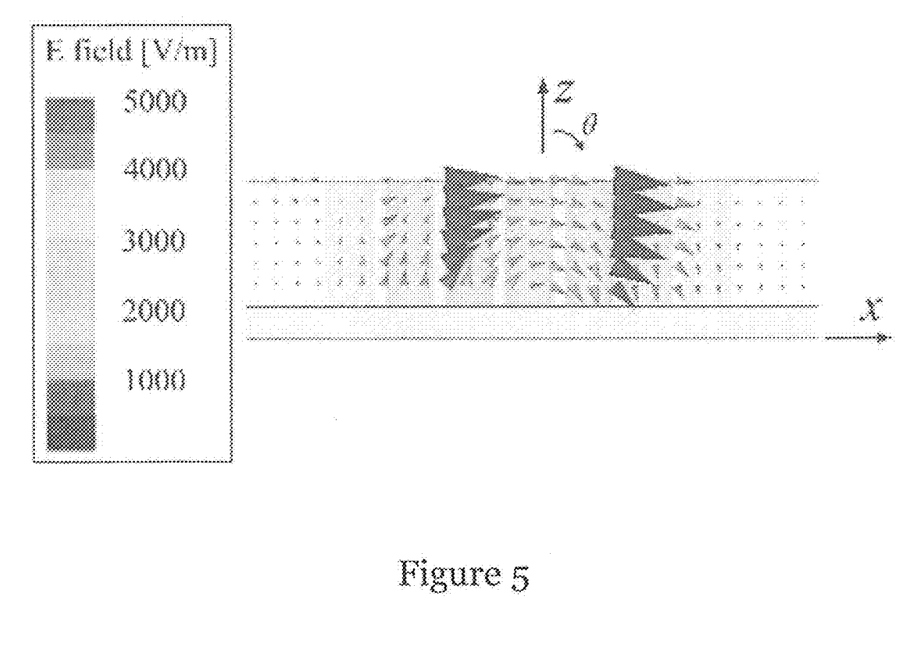
FIG. 5 is a plot showing the electric field distribution of the substrate-integrated dielectric resonator antenna of FIG. 4A.

FIG. 5 shows a simulated electric field pattern of the substrate-integrated dielectric resonator antenna 400. As shown in FIG. 5, the field distribution resembles the regular HEM11δ mode of a regular, solid dielectric resonator antenna.

Figure 6A:
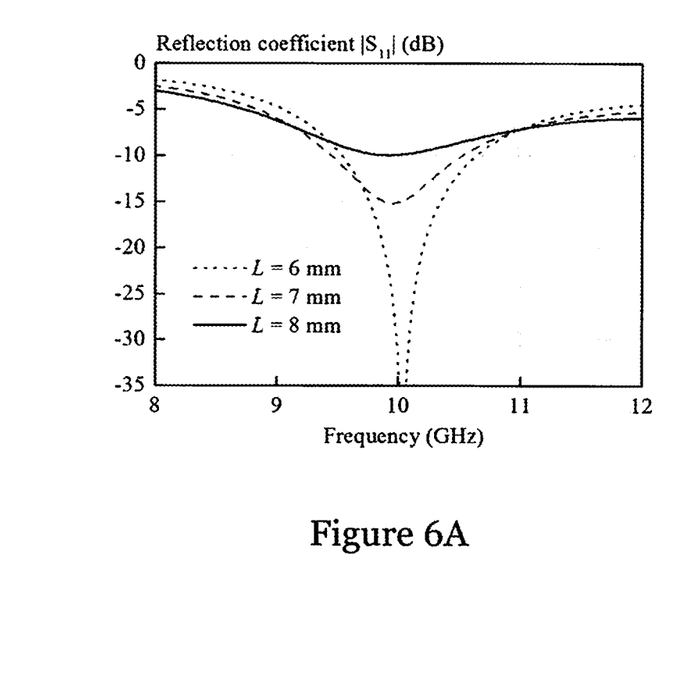
FIG. 6A is a graph showing the simulated change in reflection coefficient (dB) with frequency (Hz) for different slot lengths in the substrate-integrated dielectric resonator antenna of FIG. 4A.

FIG. 6A shows the simulated change in reflection coefficient (dB) with frequency (Hz) for different lengths (6 mm, 7 mm, 8 mm) of the slot in the substrate-integrated dielectric resonator antenna 400.

Figure 6B:
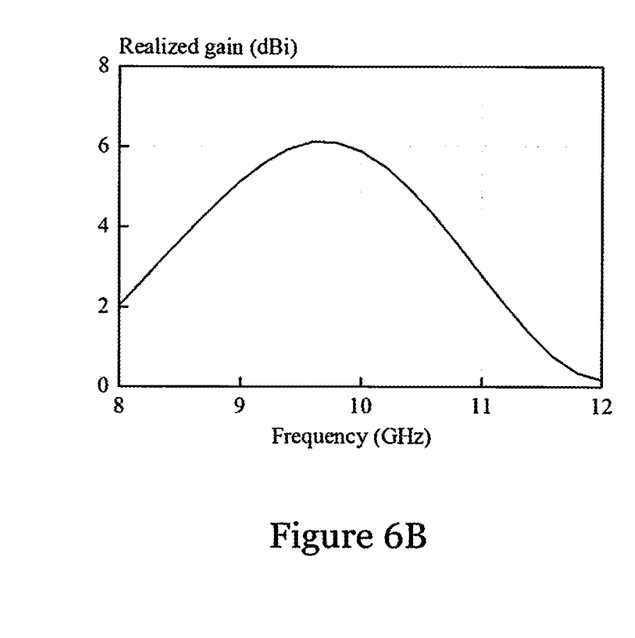
FIG. 6B is a graph showing the simulated change in realized gain (dBi) with frequency (Hz) for the substrate-integrated dielectric resonator antenna of FIG. 4A.

FIG. 6B shows the simulated change in realized gain (dBi) with frequency (Hz) for the substrate-integrated dielectric resonator antenna 400. As shown in FIG. 6B, the antenna 400 attains a realized gain of 6 dBi at 10 GHz, which is reasonable for a DRA operating in HEM11δ mode. The antenna 400 has a −10 dB bandwidth of 11%.

Figure 7A:
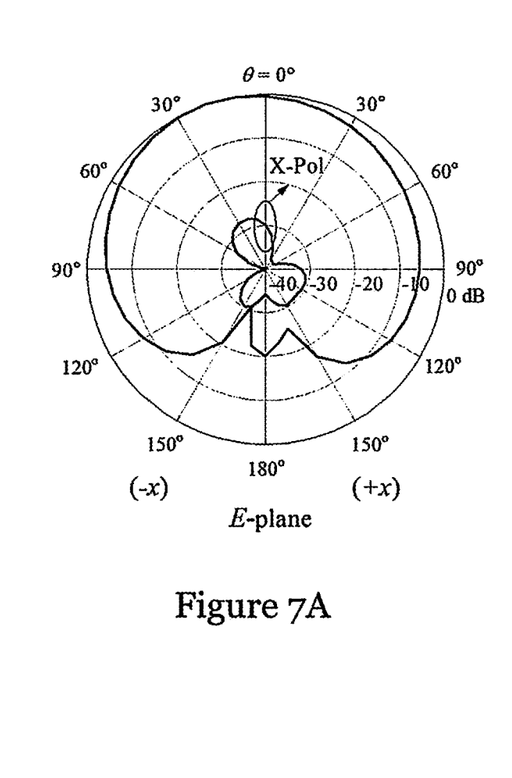
FIG. 7A is a plot showing the simulated radiation pattern of the substrate-integrated dielectric resonator antenna of FIG. 4A in the E-plane.
Figure 7B:
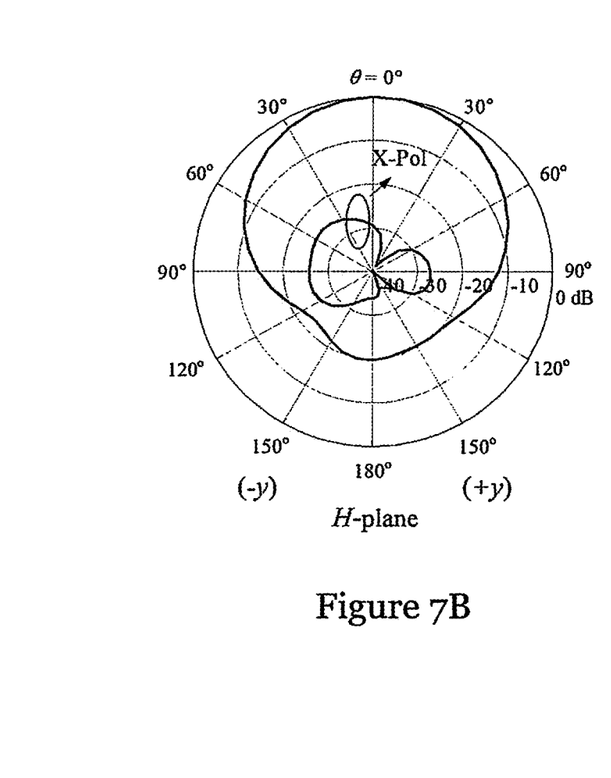
FIG. 7B is a plot showing the simulated radiation pattern of the substrate-integrated dielectric resonator antenna of FIG. 4A in the H-plane.

FIGS. 7A and 7B show the simulated radiation pattern of the substrate-integrated dielectric resonator antenna 400 in the E-plane and the H-plane respectively. As shown in FIGS. 7A and 7B, the pattern is omnidirectional as expected from a dielectric resonator antenna operating in the HEM11δ mode.

The structure and device of the above embodiments are advantageous in various aspects. First, the arrangement of dielectric vias as disclosed allow for customization of substrates such as PCB substrates, and for confining and directing electromagnetic energy. The substrate-integrated dielectric resonator antenna embodiment, by integrating the dielectric resonator antenna to the substrate using the dielectric vias, eliminates the problem associated with conventional inaccurate placement of dielectric resonator antenna on top of PCB substrate. The structure with the dielectric vias (e.g., microwave circuits and substrate-integrated dielectric resonator antenna) can be made simply and cost effectively. Other devices such as filters and oscillators can be manufactured in substrate, improving space efficiency and reducing the footprint for electronic components. The use of ceramic, pre-sintered perovskite oxide particles in some embodiments eliminate the need for high temperature sintering, thereby preventing damage to the substrate layer. Utilizing the highly reflective boundary of the wall of dielectric vias, various devices or microwave devices such as substrate-integrated waveguides (SIW), cavities, dielectric resonators, filters, resonating oscillators tank or substrate-integrated dielectric resonator antennas can be designed, with or without other metallic vias or dielectric/metal track. By utilizing the dielectric vias in the substrate-integrated waveguides, the losses occurring in the metallic sidewalls can be spared. This can be especially helpful when operating such a device at radio frequency ranges.

It will be appreciated by persons skilled in the art that numerous variations and/or modifications may be made to the invention as shown in the specific embodiments without departing from the spirit or scope of the invention as broadly described. The described embodiments of the invention should therefore be considered in all respects as illustrative, not restrictive.

For example, the shape and form of the substrate or substrate layer can be varied. The thickness of the substrate layer need not be constant. The number, position, shape (e.g., cross sectional), and arrangement of dielectric vias in the substrate can be varied. In some examples, there can be only one dielectric vias. The dielectric vias may be arranged in a regular pattern, e.g., one that has an axis of symmetry, or may be arranged in a random, irregular pattern. The dielectric vias need not be completely filled with dielectric material. Instead, it could be filled partly with or coated with the dielectric material. The dielectric constant of the substrate and the dielectric constant of the dielectric material can take other values, depending on applications, so long as the dielectric constant of the dielectric material is larger than the dielectric constant of the substrate. The dielectric material can be fixed or retained or enclosed in the via-holes using various chemical or mechanical means, not limited to heating or enclosing with material layers as provided above. The upper and lower metallic layers in FIG. 3 can be replaced by the dielectric material (paste form or solid form) serving as electric wall. The dielectric resonator antenna can be excited in various ways, not necessarily by or via the slot.

The invention claimed is:

1. A substrate-integrated dielectric resonator, comprising:
a substrate layer with a first dielectric constant; and
a plurality of dielectric vias each having
a via-hole extending through the substrate layer, and
a dielectric material with a second dielectric constant contained within the via-hole;
wherein the second dielectric constant is larger than the first dielectric constant.

2. The substrate-integrated dielectric resonator of claim 1, wherein the via-holes are filled substantially completely with the dielectric material.

3. The substrate-integrated dielectric resonator of claim 1, wherein the first dielectric constant is at least 2 and the second dielectric constant is at least 4.

4. The substrate-integrated dielectric resonator of claim 1, wherein the plurality of dielectric vias comprises dielectric vias arranged in at least two parallel rows, each of the two parallel rows having two or more dielectric vias.

5. The substrate-integrated dielectric resonator of claim 4, wherein the plurality of dielectric vias further comprises one or more dielectric vias arranged between the two parallel rows.

6. The substrate-integrated dielectric resonator of claim 4, wherein a wave guiding channel is defined between two adjacent parallel rows.

7. The substrate-integrated dielectric resonator of claim 1, wherein the dielectric material comprises perovskite oxide.

8. The substrate-integrated dielectric resonator of claim 7, wherein the perovskite oxide comprise one or more of: Barium Titanate, Barium Strontium Titanate, Lead ZirconateTitanate, and Lead Lanthanum ZirconateTitanate.

9. The substrate-integrated dielectric resonator of claim 1, wherein the dielectric material is in the form of a paste; and wherein the paste comprises perovskite oxide particles.

10. The substrate-integrated dielectric resonator of claim 9, wherein the perovskite oxide particles comprise one or more of: Barium Titanate particles, Barium Strontium Titanate particles, Lead ZirconateTitanate particles, and Lead Lanthanum ZirconateTitanate particles.

11. The substrate-integrated dielectric resonator of claim 9, wherein the perovskite oxide particles are sized between 30 nm to 2000 nm.

12. The substrate-integrated dielectric resonator of claim 9, wherein the perovskite oxide particles has an average size between 30 nm to 2000 nm.

13. The substrate-integrated dielectric resonator of claim 1, further comprising a first material layer arranged on one side of the substrate layer.

14. The substrate-integrated dielectric resonator of claim 13, wherein the first material layer comprises a prepreg, a metallic layer, or a dielectric layer with the dielectric material.

15. The substrate-integrated dielectric resonator of claim 13, further comprising a second material layer arranged on the other side of the substrate layer.

16. The substrate-integrated dielectric resonator of claim 15, wherein the second material layer comprises a prepreg, a metallic layer, or a dielectric layer with the dielectric material.

17. The substrate-integrated dielectric resonator of claim 1, wherein the substrate-integrated dielectric resonator is arranged to operate at radio frequency range.

18. The substrate-integrated dielectric resonator of claim 1, wherein the substrate-integrated dielectric resonator is part of a substrate-integrated dielectric resonator antenna.

19. The substrate-integrated dielectric resonator of claim 1, wherein the substrate-integrated dielectric resonator is part of a substrate-integrated dielectric resonator filter.

20. The substrate-integrated dielectric resonator of claim 1, wherein the plurality of dielectric vias are spaced apart evenly.

21. The substrate-integrated dielectric resonator of claim 1, wherein the second dielectric constant is at least two times the first dielectric constant.

22. A method for making a substrate-integrated dielectric resonator, comprising:
arranging, in a plurality of via-holes of a substrate layer with a first dielectric constant, a dielectric material with a second dielectric constant, thereby forming a plurality of dielectric vias each having
a via-hole formed in the substrate layer, and
a dielectric material with a second dielectric constant contained within the via-hole;
wherein the second dielectric constant is larger than the first dielectric constant.

23. The method of claim 22, wherein arranging the dielectric material in the plurality of via-holes comprises:
filling the plurality of via-holes substantially completely with the dielectric material.

24. The method of claim 22, wherein the first dielectric constant is at least 2 and the second dielectric constant is at least 4.

25. The method of claim 22, wherein the dielectric material comprises perovskite oxide.

26. The method of claim 25, wherein the perovskite oxide comprise one or more of: Barium Titanate, Barium Strontium Titanate, Lead ZirconateTitanate, and Lead Lanthanum ZirconateTitanate.

27. The method of claim 22, wherein arranging the dielectric material in the plurality of via-holes comprises:
arranging a paste including the dielectric material in the plurality of via-holes.

28. The method of claim 27, wherein the paste comprises pre-sintered perovskite oxide particles and a solvent.

29. The method of claim 28, wherein the pre-sintered perovskite oxide particles comprise one or more of: Barium Titanate particles, Barium Strontium Titanate particles, Lead ZirconateTitanate particles, and Lead Lanthanum ZirconateTitanate particles.

30. The method of claim 28, wherein the solvent comprises one or more of: Xylene, Toluene, and Tetrahydrofuran.

31. The method of claim 27, wherein arranging the dielectric material in the plurality of via-holes further comprises:
heating the paste to evaporate the solvent and attach the dielectric material to the substrate.

32. The method of claim 27, wherein arranging the dielectric material in the plurality of via-holes further comprises:
enclosing the one or more via-holes to retain the paste in the plurality of via-holes.

33. The method of claim 32, wherein enclosing the plurality of via-holes includes:
arranging a first material layer on one side of the substrate and at a first end of the plurality of via-holes and arranging a second material layer on another side of the substrate and at a second end of the plurality of via-holes to enclose the plurality of via-holes.

34. The method of claim 33, wherein the first material layer and the second material layer each comprises a prepreg, a metallic layer, or a dielectric layer with the dielectric material.

* * * * *